US012575325B2

(12) United States Patent
Qian et al.

(10) Patent No.: US 12,575,325 B2
(45) Date of Patent: Mar. 10, 2026

(54) CANTILEVER SENSOR WITH MODIFIED RESONANCE FREQUENCY

(71) Applicant: Skyworks Solutions, Inc., Irvine, CA (US)

(72) Inventors: You Qian, Singapore (SG); Rakesh Kumar, Singapore (SG); Guofeng Chen, Fremont, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 240 days.

(21) Appl. No.: 18/050,920

(22) Filed: Oct. 28, 2022

(65) Prior Publication Data

US 2023/0135200 A1 May 4, 2023

Related U.S. Application Data

(60) Provisional application No. 63/263,363, filed on Nov. 1, 2021, provisional application No. 63/263,362, filed on Nov. 1, 2021.

(51) Int. Cl.
*H04R 17/02* (2006.01)
*B81C 1/00* (2006.01)
(Continued)

(52) U.S. Cl.
CPC ........... *H04R 17/02* (2013.01); *B81C 1/0015* (2013.01); *B81C 1/00166* (2013.01);
(Continued)

(58) Field of Classification Search
CPC .. H04R 17/02; H04R 31/00; H04R 2201/003; H04R 1/36; H04R 1/326; B81C 1/0015;
(Continued)

(56) References Cited

U.S. PATENT DOCUMENTS 5,883,705 A * 3/1999 Minne .................... G01Q 10/06
355/71
6,028,389 A 2/2000 Bernstein
(Continued)

FOREIGN PATENT DOCUMENTS

CN 109495829 A 3/2019
CN 110545514 A 12/2019
(Continued)

OTHER PUBLICATIONS

Gao et al., "A novel V-shaped cross section cantilever sensor for monitoring concentrated masses with improved detecting sensitivity and measuring accuracy", in IEEE Sensors Journal, vol. 14(2):514-521 (2014).

*Primary Examiner* — Angelica M McKinney
(74) *Attorney, Agent, or Firm* — Knobbe, Martens, Olson & Bear, LLP

(57) ABSTRACT

A cantilever sensor (e.g., piezoelectric sensor) includes a beam with a sensor or electrode at a proximal end and a tip that extends from the sensor to the distal (unsupported) end of the beam. The tip is modified to modify (e.g., tune) the resonant frequency of the cantilever sensor. The resonant frequency of the cantilever sensor is tuned by using a material for the tip with a stiffness (e.g., a Young's Modulus) and/or a mass or density that results in the desired resonant frequency. The resonant frequency of the cantilever sensor can also be tuned by modifying the shape of the tip to have a higher vertical structure in a Z direction transverse to a length of the beam of the sensor.

18 Claims, 10 Drawing Sheets

(51) Int. Cl.
    *H04R 31/00*        (2006.01)
    *H10N 30/30*        (2023.01)

(52) U.S. Cl.
    CPC ........... *H04R 31/00* (2013.01); *H10N 30/306* (2023.02); *H04R 2201/003* (2013.01)

(58) Field of Classification Search
    CPC .............. B81C 1/00166; H10N 30/306; H10N 30/302; B81B 2201/0257; B81B 2203/0118; B81B 3/0045; B82Y 35/00; H01H 1/0036; G01N 29/022; G01N 2291/0256; G01N 2291/0427; G01N 2291/0255; G01H 11/08
    See application file for complete search history.

(56)                  References Cited

U.S. PATENT DOCUMENTS

| | | |
|---|---|---|
| 6,657,517 B2 | 12/2003 | Barber |
| 6,857,501 B1 | 2/2005 | Han |
| 7,253,488 B2 | 8/2007 | Zhan et al. |
| 7,763,947 B2 | 7/2010 | Zhan et al. |
| 7,951,636 B2 | 5/2011 | Lee et al. |
| 8,466,606 B2 | 6/2013 | Chen |
| 8,531,088 B2 | 9/2013 | Grosh |
| 8,582,788 B2 | 11/2013 | Leidl et al. |
| 8,896,184 B2 | 11/2014 | Grosh et al. |
| 9,029,963 B2 | 5/2015 | Sparks et al. |
| 9,055,372 B2 | 6/2015 | Grosh |
| 9,386,379 B2 | 7/2016 | Sparks |
| 9,479,875 B2 | 10/2016 | Hall |
| 9,516,421 B1 | 12/2016 | Loeppert |
| 9,853,201 B2 | 12/2017 | Grosh et al. |
| 10,001,391 B1 | 6/2018 | Littrell |
| 10,170,685 B2 | 1/2019 | Grosh et al. |
| 10,356,531 B2 | 7/2019 | Giusti et al. |
| 10,825,982 B1 | 11/2020 | Littrell et al. |
| 11,099,078 B1 | 8/2021 | Littrell |
| 11,159,893 B1 | 10/2021 | Kervran |
| 11,350,219 B2 | 5/2022 | Hui et al. |
| 11,553,280 B2 | 1/2023 | Hui et al. |
| 12,219,333 B2 * | 2/2025 | Chen ........................ H04R 3/00 |
| 12,391,546 B1 | 8/2025 | Qian et al. |
| 2006/0230835 A1 | 10/2006 | Wang |
| 2008/0219469 A1 | 9/2008 | Simidian et al. |
| 2009/0116662 A1 | 5/2009 | Wu |
| 2009/0301196 A1 * | 12/2009 | Wang ................... G01N 29/022 |
| | | 73/579 |
| 2010/0132174 A1 | 6/2010 | Kim et al. |
| 2010/0207495 A1 | 8/2010 | Kikushima et al. |
| 2011/0124124 A1 | 5/2011 | Shih |
| 2012/0091546 A1 | 4/2012 | Langereis et al. |
| 2012/0319217 A1 | 12/2012 | Dehe et al. |
| 2013/0329920 A1 | 12/2013 | Grosh et al. |

| | | |
|---|---|---|
| 2015/0119758 A1 | 4/2015 | Rogers et al. |
| 2015/0255308 A1 | 9/2015 | Lin |
| 2015/0266717 A1 | 9/2015 | Okamoto |
| 2016/0249122 A1 | 8/2016 | Popper |
| 2016/0258824 A1 | 9/2016 | Fuji |
| 2016/0315247 A1 | 10/2016 | Boser et al. |
| 2016/0352309 A1 | 12/2016 | Xu et al. |
| 2017/0318385 A1 | 11/2017 | Harney |
| 2018/0035229 A1 | 2/2018 | Deas |
| 2018/0077497 A1 | 3/2018 | Hatipoglu |
| 2018/0131543 A1 * | 5/2018 | Li ........................... H04L 27/16 |
| 2018/0138391 A1 | 5/2018 | Gros |
| 2018/0186623 A1 | 7/2018 | Vossough |
| 2019/0016588 A1 | 1/2019 | Bretthauer |
| 2019/0141450 A1 | 5/2019 | Yoon et al. |
| 2019/0177155 A1 | 6/2019 | Qian |
| 2019/0200119 A1 | 6/2019 | Kang et al. |
| 2019/0248084 A1 | 8/2019 | Straitiff et al. |
| 2019/0289405 A1 | 9/2019 | Littrell |
| 2019/0297441 A1 | 9/2019 | Dehe et al. |
| 2019/0327562 A1 | 10/2019 | Cerini et al. |
| 2019/0348050 A1 | 11/2019 | Kim et al. |
| 2019/0367355 A1 | 12/2019 | Bretthauer |
| 2020/0148532 A1 | 5/2020 | Grosh et al. |
| 2020/0158564 A1 | 5/2020 | Yoon et al. |
| 2020/0168402 A1 | 5/2020 | Eid et al. |
| 2020/0370951 A1 | 11/2020 | Kang et al. |
| 2020/0408799 A1 | 12/2020 | Littrell |
| 2020/0409238 A1 | 12/2020 | Chen et al. |
| 2021/0021936 A1 | 1/2021 | Hui et al. |
| 2021/0051413 A1 | 2/2021 | Hui et al. |
| 2021/0051414 A1 | 2/2021 | Duan et al. |
| 2021/0120345 A1 | 4/2021 | Hui et al. |
| 2021/0120346 A1 | 4/2021 | Hui et al. |
| 2021/0126615 A1 | 4/2021 | Yoon et al. |
| 2021/0382085 A1 | 12/2021 | Bretthauer et al. |
| 2022/0060814 A1 * | 2/2022 | Kang ..................... H04R 1/326 |
| 2022/0073342 A1 | 3/2022 | Ho et al. |
| 2022/0166403 A1 | 5/2022 | Doll |
| 2022/0408185 A1 | 12/2022 | Barsukou |
| 2023/0136347 A1 | 5/2023 | Qian et al. |
| 2023/0143656 A1 * | 5/2023 | Littrell ..................... H04R 7/06 |
| | | 257/415 |

FOREIGN PATENT DOCUMENTS

| | | | | |
|---|---|---|---|---|
| CN | 212850998 U | 3/2021 | | |
| JP | 2010232971 A | 10/2010 | | |
| JP | 2013-229800 | 11/2013 | | |
| JP | 2018 137297 A | 8/2018 | | |
| JP | 2019161030 A | * 9/2019 | ............. | H04R 17/02 |
| KR | 10-1545271 | 8/2015 | | |
| TW | 1727164 B | 5/2021 | | |
| WO | WO 2017/200219 A1 | 11/2017 | | |
| WO | WO 2021/098562 | 5/2021 | | |
| WO | WO 2022/104932 | 5/2022 | | |

* cited by examiner

HIGHER DENSITY →

HIGHER YOUNG'S MODULUS →

RESONANT FREQUENCY (f0, in kHz)

|  | 0.8*v | v | 1.2*v |
|---|---|---|---|
| 0.8*E | 12.3 | 11.0 | 10.0 |
| E | 12.6 | 11.3 | 10.3 |
| 1.2*E | 12.9 | 11.5 | 10.5 |

VOLTAGE OUTPUT (V, in mV)

|  | 0.8*v | v | 1.2*v |
|---|---|---|---|
| 0.8*E | 2.06 | 2.06 | 2.06 |
| E | 2.07 | 2.07 | 2.07 |
| 1.2*E | 2.07 | 2.08 | 2.08 |

DEFLECTION (nM)

|  | 0.8*v | v | 1.2*v |
|---|---|---|---|
| 0.8*E | 64.6 | 64.6 | 64.8 |
| E | 61.8 | 61.9 | 62.0 |
| 1.2*E | 60.0 | 60.0 | 60.1 |

FIG.4

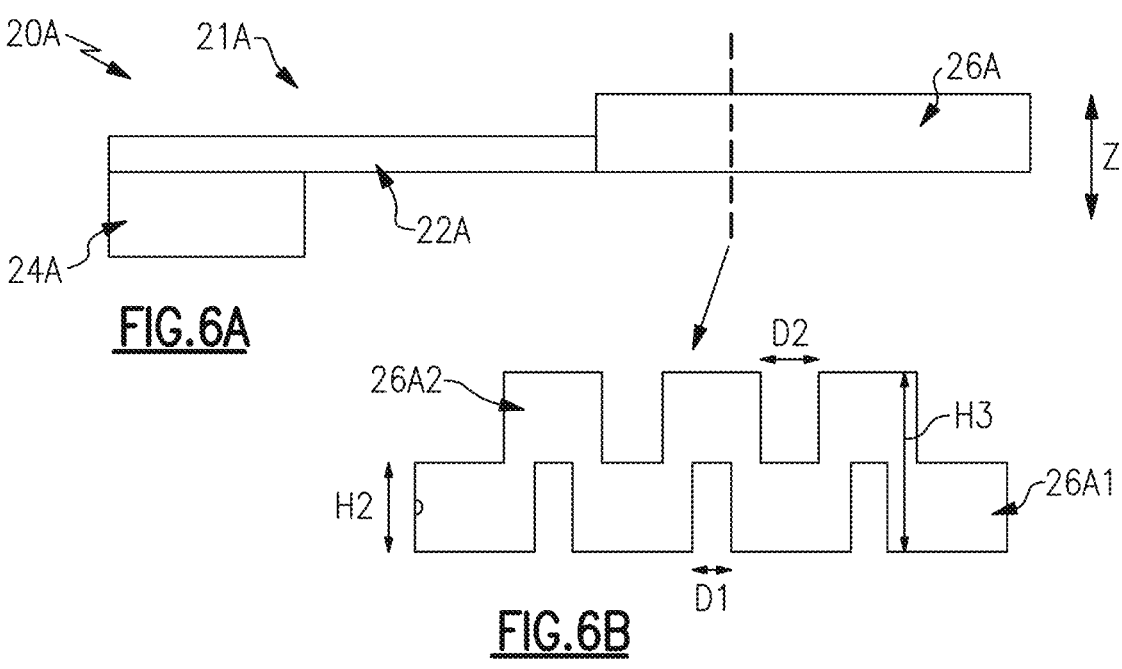
FIG.6A
FIG.6B
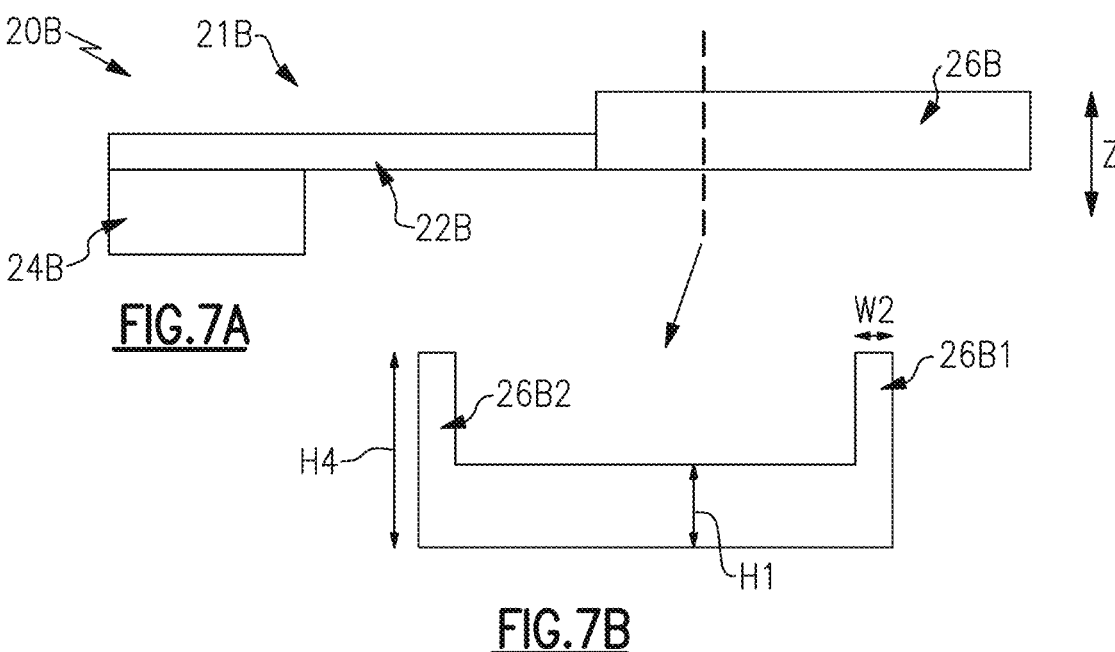
FIG.7A
FIG.7B

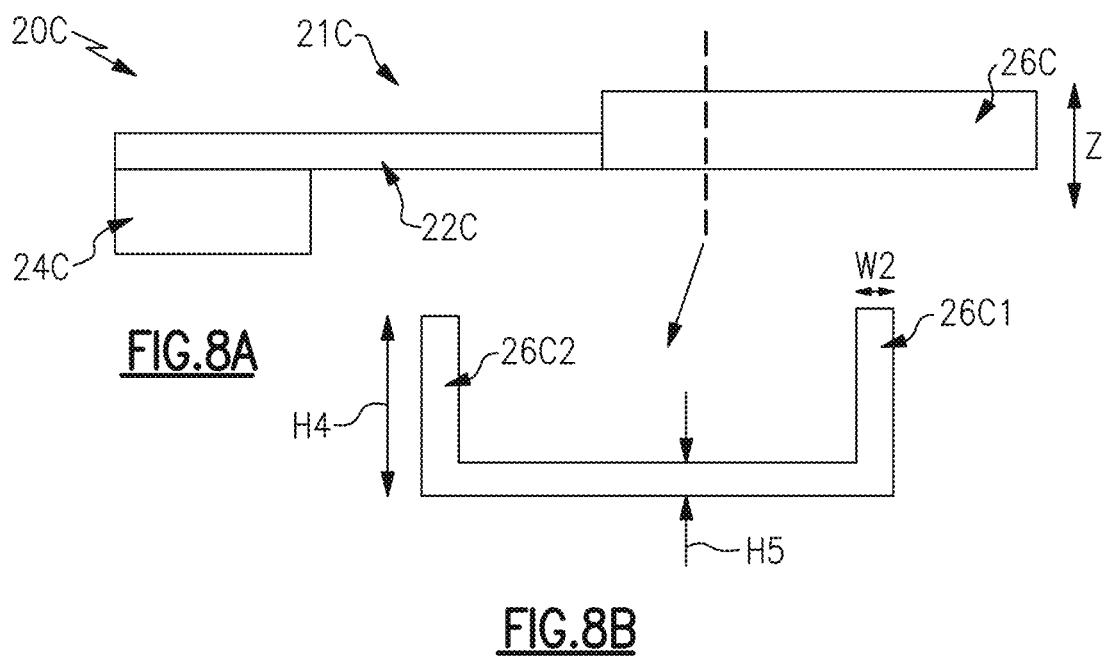
FIG.8A
FIG.8B
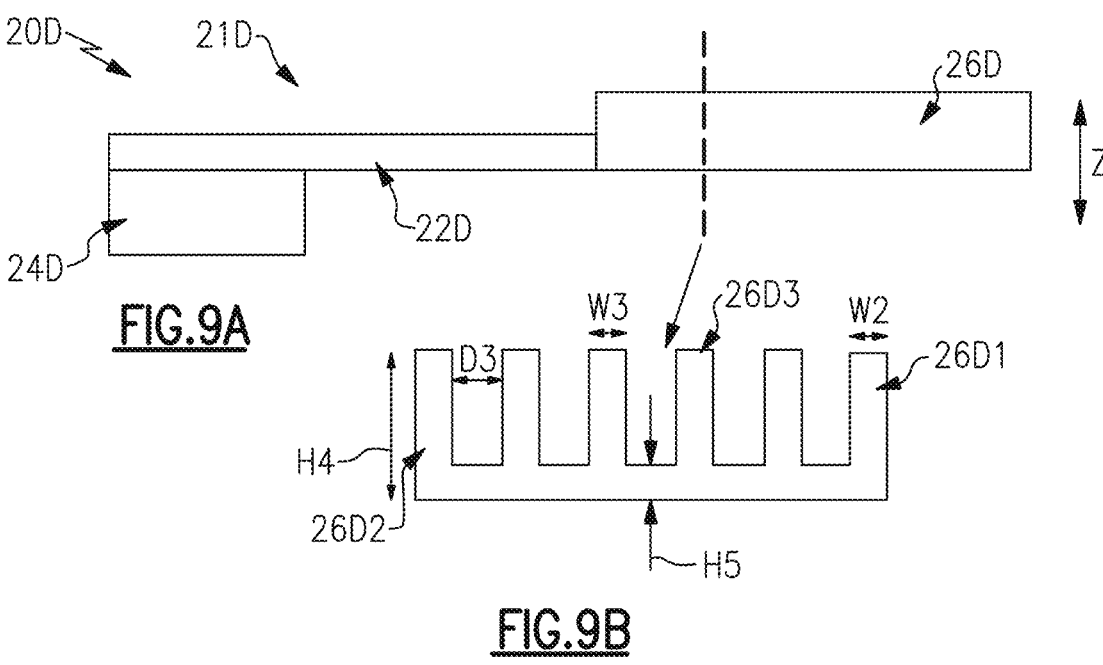
FIG.9A
FIG.9B

30

IDENTIFY CANTILEVER SENSOR STRUCTURE
FOR DESIRED APPLICATION                    ⌐32

TUNE RESONANT FREQUENCY FOR CANTILEVER
SENSOR BY FORMING TIP OF THE SENSOR BEAM
OF A MATERIAL WITH THE STIFFNESS AND/OR    ⌐34
DENSITY THAT ACHIEVES THE DESIRED
RESONANT FREQUENCY

FORMING OR ATTACHING ELECTRODE TO
PROXIMAL END OF BEAM                       ⌐36

50

IDENTIFY CANTILEVER SENSOR STRUCTURE
FOR DESIRED APPLICATION                    52

TUNE RESONANT FREQUENCY FOR CANTILEVER
SENSOR BY FORMING TIP OF THE SENSOR BEAM
HAVING A VERTICAL STRUCTURE THAT PROVIDES
A STIFFNESS OR MATERIAL DENSITY THAT          54
ACHIEVES THE DESIRED RESONANT FREQUENCY
IN THE Z DIRECTION

FORMING OR ATTACHING ELECTRODE TO
PROXIMAL END OF BEAM                    56

CANTILEVER SENSOR WITH MODIFIED RESONANCE FREQUENCY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to cantilever sensors for use with devices, such as piezoelectric microelectrome-chanical systems (MEMS) microphones, and in particular to cantilever sensors with modified resonance frequency and to a method for modifying the resonance frequency of (e.g., piezoelectric) cantilever sensors.

Description of the Related Art

A MEMS microphone is a micro-machined electrome-chanical device used to convert sound pressure (e.g., voice sound) to an electrical signal (e.g., voltage). MEMS micro-phones are widely used in mobile devices, headsets, smart speakers and other voice-interface devices or systems. Con-ventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones include cantilever MEMS structures, and are mostly based on sputter-deposited thin film piezoelectric structure. Piezo-electric MEMS microphones use piezoelectric cantilever sensors to convert acoustic pressure into electrical signals.

SUMMARY

Accordingly, there is a need for a method of making a (piezoelectric) cantilever sensor with modified resonant fre-quency.

In accordance with one aspect of the disclosure, a canti-lever sensor (e.g., piezoelectric sensor) includes a beam with a sensor or electrode at a proximal end and a tip that extends from the sensor to the distal (unsupported) end of the beam, where the tip is modified to modify (e.g., tune) the resonant frequency of the cantilever sensor. In one implementation, the resonant frequency of the sensor is increased by using a material for the tip with a higher stiffness (e.g., a higher Young's Modulus) and/or a lower mass or density. In another implementation, the resonant frequency of the can-tilever sensor is decreased by using a material for the tip with a lower stiffness (e.g., a lower Young's Modulus) and/or a higher mass or density. In another implementation, the resonant frequency of the sensor is increased by modi-fying the shape of the tip to have a higher stiffness in one direction (e.g., in a z direction).

In accordance with one aspect of the disclosure, there is a need for an acoustic device with piezoelectric cantilever sensors with modified resonant frequency, for example, a piezoelectric MEMS microphone.

In accordance with one aspect of the disclosure, a canti-lever sensor with increased resonant frequency is provided. The cantilever sensor comprises a substrate and a beam having a proximal portion attached to the substrate and extending to an unsupported distal end of the beam. An electrode is disposed on or in the proximal portion of the beam, a tip of the beam extending distally of the electrode, where at least a portion of the tip has a greater height in a Z direction transverse to a length of the beam than the proximal portion of the beam.

In accordance with another aspect of the disclosure, a piezoelectric microelectromechanical systems (MEMS) microphone is provided. The piezoelectric MEMS micro-phone comprises a substrate and a plurality of piezoelectric sensors movably coupled to the substrate. Each of the piezoelectric sensors is spaced apart from an adjacent piezo-electric sensor by a gap and includes: a beam having a proximal portion attached to the substrate and extending to an unsupported distal end of the beam, and an electrode disposed on or in the proximal portion of the beam, a tip of the beam extending distally of the electrode. At least a portion of the tip has a greater height in a Z direction transverse to a length of the beam than the proximal portion of the beam. The plurality of piezoelectric sensors are configured to deflect when subjected to sound pressure.

In accordance with another aspect of the disclosure, an audio subsystem is provided. The audio subsystem com-prises an audio codec and one or more piezoelectric micro-electromechanical systems microphones in communication with the audio codec. Each microphone includes: a substrate and a plurality of piezoelectric sensors movably coupled to the substrate, each of the piezoelectric sensors spaced apart from an adjacent piezoelectric sensor by a gap and including a beam having a proximal portion attached to the substrate and extending to an unsupported distal end of the beam, a tip of the beam extending distally of the electrode. At least a portion of the tip has a greater height in a Z direction transverse to a length of the beam than the proximal portion of the beam.

In accordance with another aspect of the disclosure, a method of making a cantilever sensor is provided. The method comprises forming or providing a beam extending between a proximal portion and a distal end, and forming or providing an electrode. The method also comprises attach-ing the electrode to a proximal portion of the beam, a distal portion of the beam between the electrode and distal end defining a tip of the sensor, and attaching the beam to a substrate in cantilever form so that the proximal portion of the beam is anchored to the substrate and the distal end of the beam is unsupported. Forming or providing the beam includes tuning the sensor to a desired resonant frequency by forming at least the tip of the beam of a material having one or both of a density and Young's modulus that provides the desired resonant frequency.

In accordance with another aspect of the disclosure, a method of making a cantilever sensor is provided. The method comprises forming or providing a beam extending between a proximal portion and a distal end, and forming or providing an electrode. The method also comprises attach-ing the electrode to a proximal portion of the beam, a distal portion of the beam between the electrode and distal end defining a tip of the sensor, and attaching the beam to a substrate in cantilever form so that the proximal portion of the beam is anchored to the substrate and the distal end of the beam is unsupported. Forming or providing the beam includes forming at least the tip of the beam so that it has a greater height in a Z direction transverse to a length of the beam than the proximal portion of the beam to thereby tune a resonant frequency of the sensor.

BRIEF DESCRIPTION OF THE DRAWINGS

FIG. 4 is a table graph of resonant frequency, voltage output and deflection relative to density and Young's Modulus for a cantilever sensor.

FIG. 6A is a schematic side view of a cantilever sensor.

FIG. 6B is a schematic transverse cross-sectional view of the cantilever sensor of FIG. 6A.

FIG. 7A is a schematic side view of a cantilever sensor.

FIG. 7B is a schematic transverse cross-sectional view of the cantilever sensor of FIG. 7A.

FIG. 8A is a schematic side view of a cantilever sensor.

FIG. 8B is a schematic transverse cross-sectional view of the cantilever sensor of FIG. 8A.

FIG. 9A is a schematic side view of a cantilever sensor.

FIG. 9B is a schematic transverse cross-sectional view of the cantilever sensor of FIG. 9A.

DETAILED DESCRIPTION

Figure 1A:
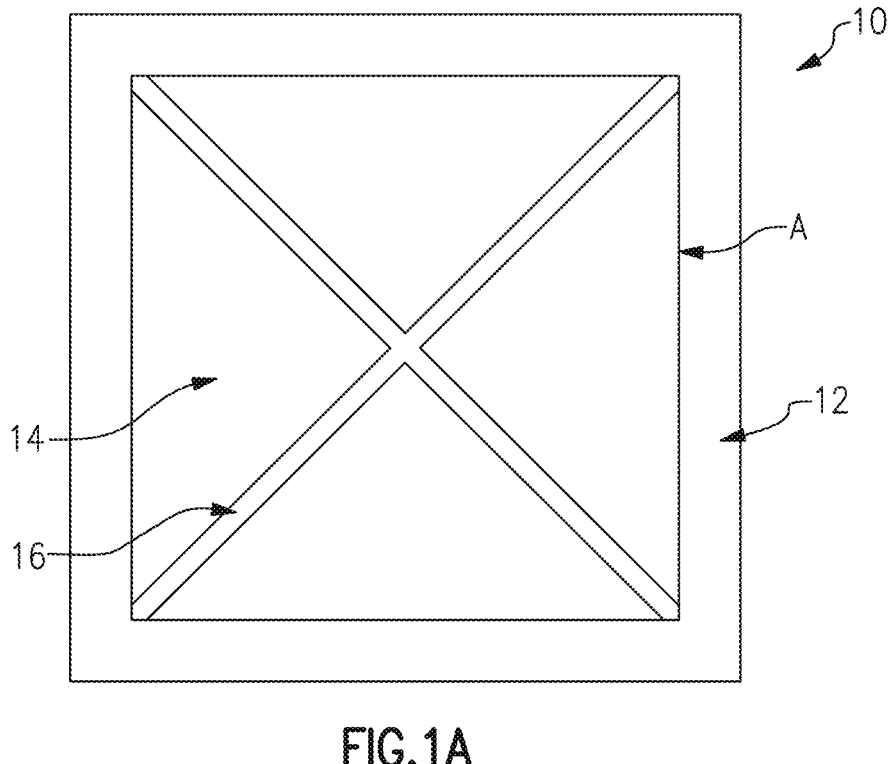
FIG. 1A is a schematic top view of a substrate and sensors for a piezoelectric MEMS microphone.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Piezoelectric MEMS Microphone

Figure 1B:
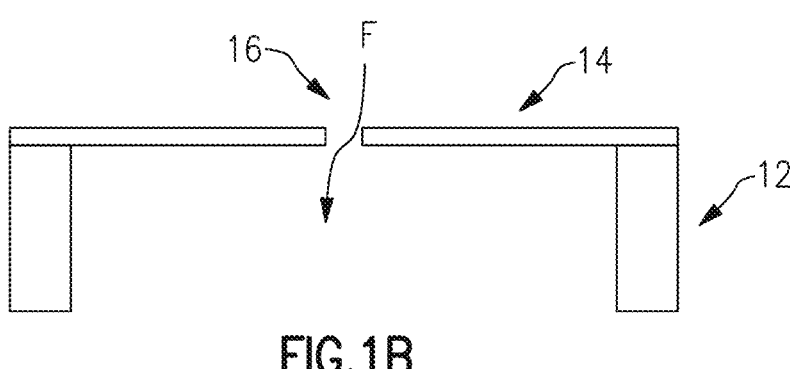
FIG. 1B is a schematic side view of the substrate and sensors for the piezoelectric MEMS microphone of FIG. 1A.

FIGS. 1A-1B show a piezoelectric microelectromechanical systems (MEMS) microphone 10 (hereinafter the "microphone"). The microphone 10 has a substrate 12. The substrate 12 is optionally made of Silicon and may optionally have additional dielectric, metallic or semiconductor films deposited on it. The microphone 10 can have one or more piezoelectric sensors 14 (hereinafter "sensors") anchored to the substrate 12 in cantilever form with a gap 16 between adjacent sensors 14. The microphone 10 converts an acoustic signal to an electrical signal when a sound wave vibrates the sensors 14. The sensors 14 can be made from one or more layers of material. Optionally, the sensors 14 can be made at least in part of Aluminum Nitride (AlN). In another implementation, the sensors 14 can optionally be made at least in part of Scandium Aluminum Nitride (ScAlN) or other piezoelectric materials. The sensors 14 can include an electrode, which can optionally be made of molybdenum (Mo), titanium nitride (TiN), platinum (Pt) or ruthenium (Ru), in some implementations. The gaps 16 between the sensors 14 allow the sensors 14 to freely move, for airflow F to pass therethrough, and balance the pressure between both sides of the sensors 14. The gap 16 can be about 100-500 nm wide. The sensors 14 are preferably planar (e.g., flat), but are generally not completely flat due to a material internal stress gradient in the sensors 14.

Resonant Frequency of Cantilever Sensor

Figures 2, 3:
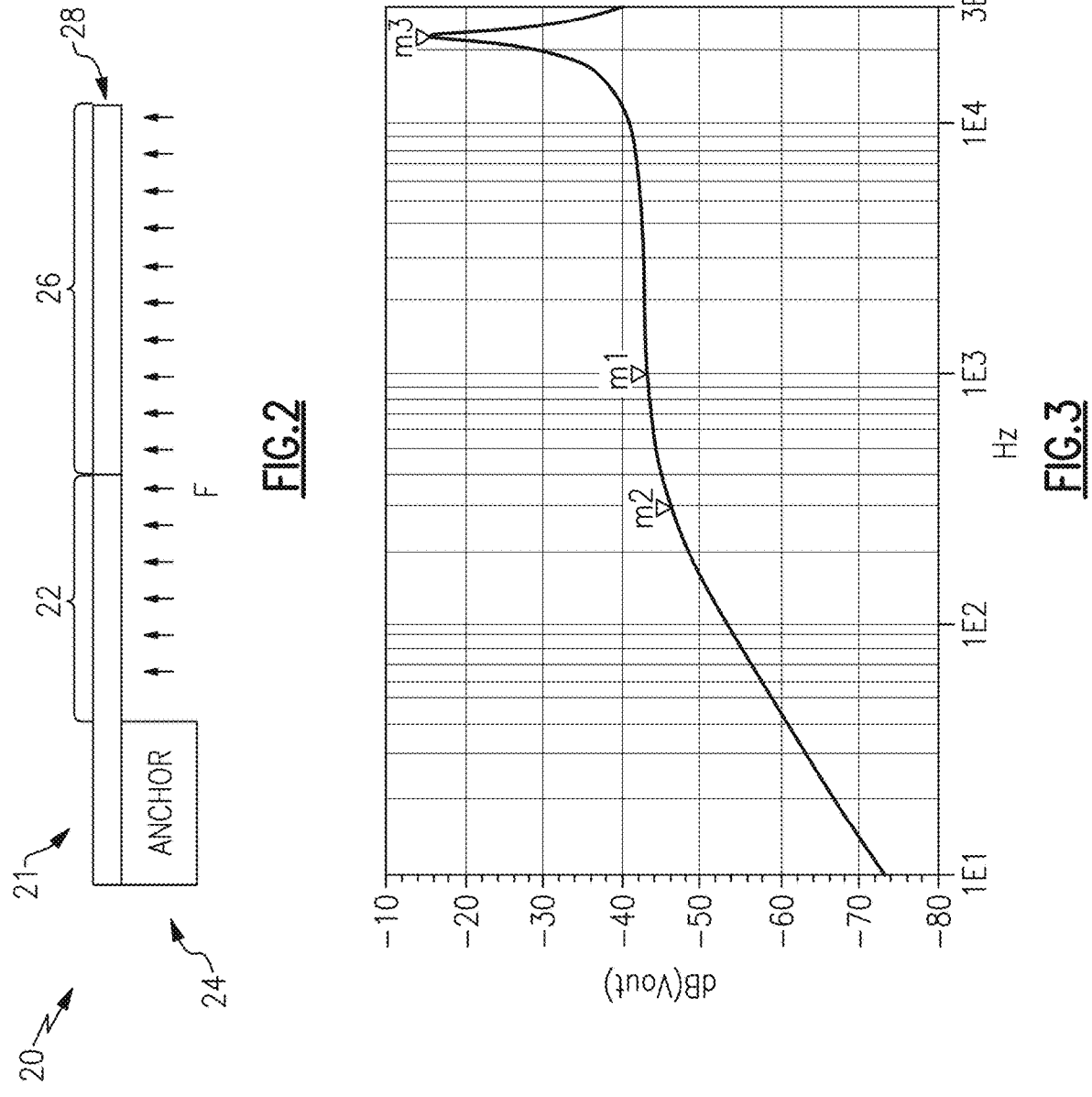
FIG. 2 is a schematic side view of a cantilever sensor.
FIG. 3 is a plot of acoustic response, showing decibels (dB) versus frequency for a piezoelectric cantilever sensor.

FIG. 2 shows a cantilever sensor 20 (e.g., a piezoelectric sensor) with a beam 21 (e.g., a triangular beam), a sensing area or electrode 22 on or in a proximal portion of the beam 21 attached to an anchor 24 (e.g., a substrate) and a tip 26 (e.g., of a piezoelectric material) of the beam 21 that extends distally of the sensing area or electrode 22 to a distal unsupported end 28. In one implementation, the tip 26 is part of a beam that is attached to the anchor 24 and the electrode 22 is disposed over or attached to a proximal end of the beam proximate the anchor 24. The sensor 20 can generate an electrical signal when it is deflected (e.g., when the tip 26 is deflected) by a force F. In one example, at least a portion of the cantilever sensor 20 (e.g., the tip 26 of the cantilever sensor 20) can be deflected when subjected to acoustic pressure. For example, a force applied on the tip 26 will deflect the sensing area or electrode 22.

FIG. 3 shows a plot of acoustic response (e.g., decibels or dB) with frequency for the cantilever sensor 20 and shows the resonant frequency peak m3 is outside the audio band (e.g., at greater than 20 KHz), but the left side of the resonant frequency peak is inside the audio band. In some implementations, it is preferable to increase the resonant frequency so that the frequency response is substantially linear (e.g., flattened) inside the audio band, as further described below.

Modifying the Resonant Frequency of a Cantilever Sensor

With reference to FIGS. 4-9B, the inventors have developed methods for modifying (e.g., increasing, decreasing) the resonant frequency of a cantilever sensor. In some implementations described herein such cantilever sensors can be implemented in a piezoelectric MEMS microphone, such as the microphone 10 in FIGS. 1A-1B. However, one of skill in the art will recognize that the cantilevered (e.g., piezoelectric) sensors with modified (e.g., increased) resonant frequency in accordance with the methods disclosed herein can be used in various other applications, such as in energy harvesting (e.g., generation of voltage and storage of energy from the movement of the sensor), or as ultrasonic transducers, accelerometers, an optical sensors.

The resonant frequency of a cantilever sensor, such as the cantilever sensor 20, is proportional to the square root of stiffness (k) over mass (m), as shown in the following formula.

$$f \propto \sqrt{\frac{k}{m}}$$

In accordance with this formula, the resonant frequency of a cantilever sensor, such as the cantilever sensor 20, can be increased by reducing the mass (or density) of at least a portion of the sensor (e.g., of the tip 26 of the sensor 20) or by increasing the stiffness (e.g., the Young's modulus E) of at least a portion of the sensor (e.g., of the tip 26 of the sensor 20). Similarly, the resonant frequency can be decreased by increasing the mass (or density) of at least a portion of the sensor (e.g., of the tip 26 of the sensor 20) or by reducing the stiffness (e.g., the Young's modulus E) of at least a portion of the sensor (e.g., of the tip 26 of the sensor 20). Therefore, the resonant frequency of the a cantilever sensor, such as the cantilever sensor 20, can be modified by modifying the mass (e.g., density) or stiffness (e.g., Young's modulus E) of at least a portion of (e.g., the tip of) the cantilever sensor.

Figures 5A, 5B:
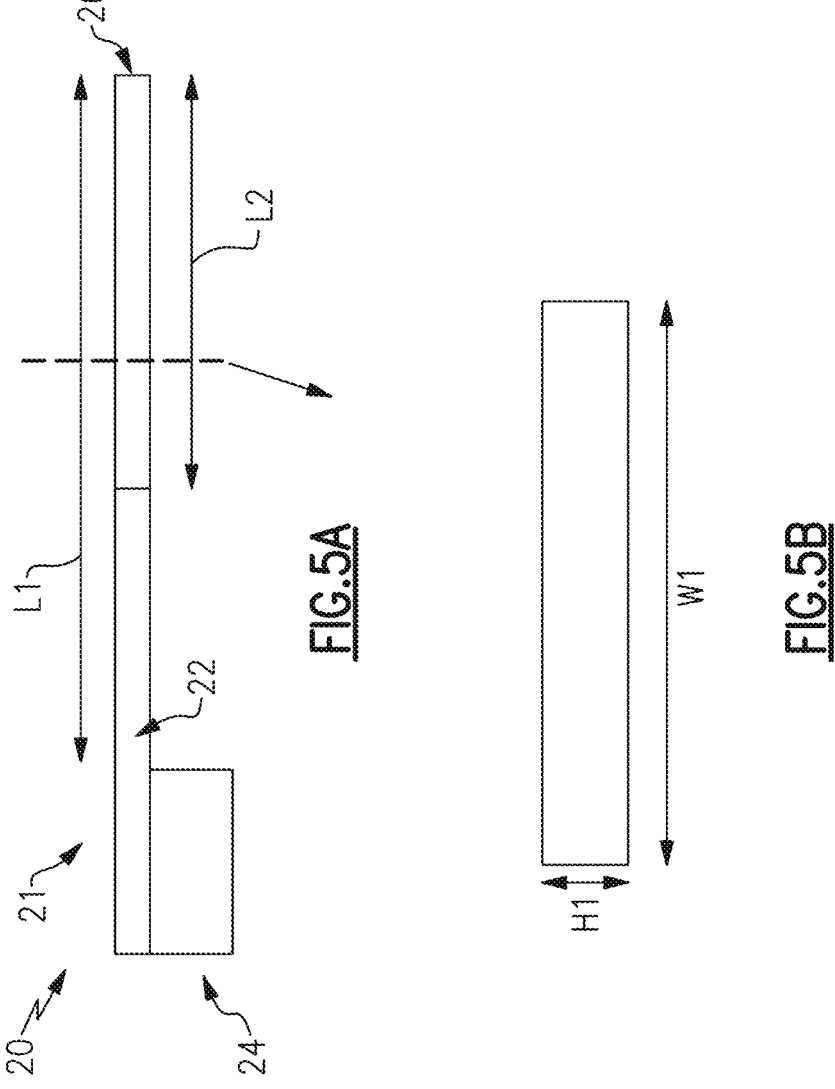
FIG. 5A is a schematic side view of a conventional piezoelectric cantilever sensor.
FIG. 5B is a schematic transverse cross-sectional view of the conventional piezoelectric cantilever sensor of FIG. 5A.

FIG. 4 a table graph of resonant frequency, voltage output and deflection for a cantilever sensor, such as the cantilever sensor 20, varying with density v (e.g., indication of mass) and Young's modulus E (e.g., indication of stiffness). With reference to FIGS. 5A-5B, the cantilever sensor 20 used as a baseline for the simulations had the tip 26 made of Aluminum Nitride (AlN) with a length L1 of the beam 21 of the sensor 20 of approximately 300 um, a length L2 of the tip 26 of the sensor of approximately 210 um, a height H1 or thickness of the tip 26 of the sensor of approximately 0.6 um and a width W1 of the tip 26 of the sensor 20 of approximately 100 um. As shown in FIG. 5B, the width W1 is in a direction transverse to a length L1 (shown in FIG. 5A) of the beam 21. The cantilever sensor 20 was determined to have a resonant frequency of 11.3 kHz, an output voltage of 2.07 mV and a maximum deflection of the beam 21 (e.g., of the tip 26 of the beam 21) of 61.9 nm, all of which are shown in the middle of the tables in FIG. 4. The beam 21 can have a uniform thickness H1 along its length L1. The beam 21 can have a uniform thickness H1 along its width W1.

With continued reference to FIG. 4, varying the density or varying the Young's modulus (e.g., to values 20% lower or 20% higher relative to the baseline) for the tip 26 did not have an effect on output voltage, as shown in the middle table in FIG. 4, as the output voltage varied no more than 0.01 mV. With respect to the effect on deflection by varying the density or varying the Young's modulus (e.g., to values 20% lower or 20% higher relative to the baseline) for the tip 26, varying density did not have a significant effect, but varying Young's modulus did affect the deflection. As shown in the right table in FIG. 4, increasing the Young's modulus by 20% from the baseline decreased the deflection from 61.9 nm to 60 nm.

With respect to the effect on resonant frequency by varying the density or varying the Young's modulus (e.g., to values 20% lower or 20% higher relative to the baseline) for the tip 26, varying density and Young's modulus did have an effect on resonant frequency. As shown in the left table in FIG. 4, increasing the Young's modulus by 20% from the baseline increased the resonant frequency from 11.3 kHz to 11.5 kHz, and decreasing the density by 20% from the baseline increased the resonant frequency from 11.3 kHz to 12.6 kHz. Therefore, one strategy for increasing resonant frequency is to increase the Young's modulus (e.g., increase stiffness) and decrease the material density for the tip 26. Similarly, one strategy for decreasing resonant frequency is to decrease the Young's modulus (e.g., decrease stiffness) and increase the material density for the tip 26.

Modifying the Resonant Frequency of a Cantilever Sensor with Different Materials In one implementation, the resonant frequency for a cantilever sensor (e.g., the cantilever sensor 20) can be modified by changing the material used for the beam (e.g., for the tip 26 of the beam 21). For example, the resonant frequency for the cantilever sensor (e.g., the cantilever sensor 20) can be increased by using a material for the beam 21 (e.g., for the tip 26 of the beam 21) with a higher stiffness (e.g., higher Young's modulus) and/or lower density. For example, as compared with the beam 21 being made of Aluminum Nitride (e.g., having a density of 3255 kg/m² and Young's modulus of 320 GPa), using instead diamond for the beam 21 (e.g., for the tip 26 of the beam 21), which has a density of 3500 kg/m² and Young's modulus of 1050 GPa, would increase the resonant frequency of the sensor 20. Similarly, using instead carbon nanotube for the beam 21 (e.g., for the tip 26 of the beam 21), which has a density of 1300 kg/m² and Young's modulus of 1000 GPa, would increase the resonant frequency of the sensor 20. Similarly, the resonant frequency for the cantilever sensor (e.g., the cantilever sensor 20) can be decreased by using a material for the beam 21 (e.g., for the tip 26 of the beam 21) with a lower stiffness (e.g., lower Young's modulus) and/or higher density.

Modifying the Resonant Frequency of a Cantilever Sensor with Different Structural Shapes In another implementation, the resonant frequency for a cantilever sensor (e.g., the cantilever sensor 20) can be modified by changing the structural shape of the beam (e.g., for the tip 26 of the beam 21), such as by changing the shape in one direction (e.g., in a Z direction), for example with a vertical buildup. FIGS. 6A-9B show different structural designs for a cantilever sensor that have a higher resonant frequency than the cantilever sensor 20 in FIGS. 5A-5B, and which have a vertical buildup so the beam (e.g., tip of the beam) has a non-rectangular cross-section transverse to a length of the beam. The cantilever sensors of FIGS. 6A-9B can be implemented in a piezoelectric MEMS microphone, such as the microphone 10 in FIGS. 1A-1B. In other implementations, the cantilever sensors of FIGS. 6A-9B can be used in various other applications, such as in energy harvesting (e.g., generation of voltage and storage of energy from the movement of the sensor), or as ultrasonic transducers, accelerometers, an optical sensors.

FIG. 6A shows a side view of a cantilever sensor 20A and FIG. 6B shows a cross-sectional view of the cantilever sensor 20A in a direction transverse to a length of the sensor 20A. Some of the features of the cantilever sensor 20A are similar to features of the cantilever sensor 20 in FIGS. 5A-5B. Thus, reference numerals used to designate the various components of the cantilever sensor 20A are identical to those used for identifying the corresponding components of the cantilever sensor 20 in FIGS. 5A-5B, except that an "A" has been added to the numerical identifier. Therefore, the structure and description for the various features of the cantilever sensor 20 in FIGS. 5A-5B (e.g., length, width) are understood to also apply to the corresponding features of the cantilever sensor 20A in FIGS. 6A-6B, except as described below.

The cantilever sensor 20A differs from the cantilever sensor 20 in that the tip 26A of the beam 21A has a corrugated shape, so the beam 21A (e.g., tip 26A of the beam 21A) has a non-rectangular cross-section transverse to a length of the beam 21A. The corrugated shape of the tip 26A is provide by a first portion 26A1 having a first height H2 that alternates with a second portion 26A2 having a second height H3 that is greater than the first height, where first portions 26A1 are spaced from each other by a first gap distance D1 and the second portions 26A2 are spaced from each other by a second gap distance D2. In one implementation, the first and second gap distances D1, D2 can be substantially equal. In another implementation, the second gap distance D2 can be different (e.g., greater) than the first gap distance D1. The first height H2 can be approximately 0.6 um and the second height H3 can be approximately 2 um. The corrugated shape of the tip 26A of the beam 21A increases a stiffness of the beam 21A in the Z direction as compared to the beam 21 of the sensor 20.

As compared with the cantilever sensor 20, which as described above has a resonant frequency of 11.3 kHz, an output voltage of 2.07 mV and a maximum beam deflection of 61.9 nm, the sensor 21A achieves a resonant frequency of 13.0 kHz, an output voltage of 1.90 mV and a maximum deflection of the beam 21A (e.g., of the tip 26A of the beam 21A) of 57.4 nm. For the sensor 21A, the resonant frequency can further be modified by changing the stiffness of the tip 26A, for example the first portions 26A1 and second portions 26A2. For example, the second height H3 can be increased, resulting in increased stiffness for the tip 26A and increased resonance frequency. In another example, the second height H3 can be decreased, resulting in decreased stiffness for the tip 26A and decreased resonance frequency.

FIG. 7A shows a side view of a cantilever sensor 20B and FIG. 7B shows a cross-sectional view of the cantilever sensor 20B in a direction transverse to a length of the sensor 20B. Some of the features of the cantilever sensor 20B are similar to features of the cantilever sensor 20 in FIGS. 5A-5B. Thus, reference numerals used to designate the various components of the cantilever sensor 20B are identical to those used for identifying the corresponding components of the cantilever sensor 20 in FIGS. 5A-5B, except that a "B" has been added to the numerical identifier. Therefore, the structure and description for the various features of the cantilever sensor 20 in FIGS. 5A-5B (e.g., length, width) are understood to also apply to the corresponding features of the cantilever sensor 20B in FIGS. 7A-7B, except as described below.

The cantilever sensor 20B differs from the cantilever sensor 20 in that the tip 26B of the beam 21B has (e.g., enhanced) first and second side edges 26B1, 26B2 with a second height H4 that is greater than a first height H1 of the remainder of the tip 26B (e.g., remainder of the tip 26B between the first and second side edges 26B1, 26B2). The beam 21B (e.g., tip 26B of the beam 21B) has a non-rectangular cross-section transverse to a length of the beam 21B. The first height H1 can be approximately 0.6 um and the second height H4 can be approximately 5 um. The shape of the tip 26B with the first and second side edges 26B1, 26B2 increases a stiffness of the beam 21B in the Z direction as compared to the beam 21 of the sensor 20.

As compared with the cantilever sensor 20, which as described above has a resonant frequency of 11.3 kHz, an output voltage of 2.07 mV and a maximum beam deflection of 61.9 nm, the sensor 21B achieves a resonant frequency of 11.9 kHz, an output voltage of 2.06 mV and a maximum deflection of the beam 21B (e.g., of the tip 26B of the beam 21B) of 54.3 nm. For the sensor 21B, the resonant frequency can further be modified by changing the stiffness of the tip 26B, for example the first and second side edges 26B1, 26B2. For example, the second height H4 can be increased, resulting in increased stiffness for the tip 26B and increased resonance frequency. In another example, the second height H4 can be decreased, resulting in decreased stiffness for the tip 26B and decreased resonance frequency.

FIG. 8A shows a side view of a cantilever sensor 20C and FIG. 8B shows a cross-sectional view of the cantilever sensor 20C in a direction transverse to a length of the sensor 20C. Some of the features of the cantilever sensor 20C are similar to features of the cantilever sensor 20B in FIGS. 7A-7B. Thus, reference numerals used to designate the various components of the cantilever sensor 20C are identical to those used for identifying the corresponding components of the cantilever sensor 20B in FIGS. 7A-7B, except that a "C" instead of a "B" has been added to the numerical identifier. Therefore, the structure and description for the various features of the cantilever sensor 20B in FIGS. 7A-7B (e.g., length, width, height) are understood to also apply to the corresponding features of the cantilever sensor 20C in FIGS. 8A-8B, except as described below.

The cantilever sensor 20C differs from the cantilever sensor 20B in that the portion of the beam 21B between the first and second side edges 26C1, 26C2 has a height or thickness H5 that is thinner than the thickness or height H1 of the beam 21B of the cantilever sensor 20B. The beam 21C (e.g., tip 26C of the beam 21C) has a non-rectangular cross-section transverse to a length of the beam 21C. The height or thickness H5 is approximately 0.3 um as compared to the height or thickness H1 of approximately 0.6 um for the beam 21B of the sensor 20B. The shape of the tip 26C with the first and second side edges 26C1, 26C2 and thinner beam 21C increases a stiffness and/or reduces a mass of the beam 21C in the Z direction as compared to the beam 21B of the sensor 20B.

As compared with the cantilever sensor 20B, which as described above has a resonant frequency of 11.9 kHz, an output voltage of 2.06 mV and a maximum beam deflection of 54.3 nm, the sensor 21C achieves a resonant frequency of 14.9 kHz, an output voltage of 2.10 mV and a maximum deflection of the beam 21C (e.g., of the tip 26C of the beam 21C) of 60.6 nm. For the sensor 21C, the resonant frequency can further be modified by changing the stiffness of the tip 26C, for example of the first and second side edges 26C1, 26C2. For example, the second height H4 can be increased, resulting in increased stiffness for the tip 26C and increased resonance frequency. In another example, the second height H4 can be decreased, resulting in decreased stiffness for the tip 26C and decreased resonance frequency. Additionally or alternatively, the thickness H5 can be reduced to decrease weight and increase resonance frequency.

FIG. 9A shows a side view of a cantilever sensor 20D and FIG. 9B shows a cross-sectional view of the cantilever sensor 20D in a direction transverse to a length of the sensor 20D. Some of the features of the cantilever sensor 20D are similar to features of the cantilever sensor 20C in FIGS. 8A-8B. Thus, reference numerals used to designate the various components of the cantilever sensor 20D are identical to those used for identifying the corresponding components of the cantilever sensor 20C in FIGS. 8A-8B, except that a "D" instead of a "C" has been added to the numerical identifier. Therefore, the structure and description for the various features of the cantilever sensor 20C in FIGS. 8A-8B (e.g., length, width, height) are understood to also apply to the corresponding features of the cantilever sensor 20D in FIGS. 9A-9B, except as described below.

The cantilever sensor 20D differs from the cantilever sensor 20C in that the sensor includes one or more (e.g., a plurality of) ridges 26D3 between the first and second side edges 26D1, 26D2, each of the ridges 26D3 having a width W3. The beam 21C (e.g., tip 26C of the beam 21C) has a non-rectangular cross-section transverse to a length of the beam 21C. The ridges 26D3 can optionally the same height as the first and second side edges 26D1, 26D2, and can be spaced from each other (and from the first and second side edges 26D1, 26D2) by a gap distance D3. The width W3 of each of the ridges 26D3 can in one implementation be equal to the width W2 of the first and second side edges 26D1, 26D2. In another implementation, the width W3 of each of the ridges 26D3 can be different (e.g., larger, smaller) than the width W2 of the first and second side edges 26D1, 26D2. The shape of the tip 26D with the first and second side edges 26D1, 26D2 and ridges 26D3 decreases a stiffness of the beam 21D in the Z direction as compared to the beam 21C of the sensor 20C.

As compared with the cantilever sensor 20C, which as described above has a resonant frequency of 14.9 kHz, an output voltage of 2.10 mV and a maximum beam deflection of 60.6 nm, the sensor 21D achieves a resonant frequency of 12.7 kHz, an output voltage of 2.14 mV and a maximum deflection of the beam 21D (e.g., of the tip 26D of the beam 21D) of 50.6 nm. For the sensor 21D, the resonant frequency can further be modified by changing the stiffness of the tip 26D, for example of the first side edge 26D1, second side edge 26D2 and/or ridges 26D3. For example, the second height H4 can be increased, resulting in increased stiffness for the tip 26D and increased resonance frequency. In another example, the second height H4 can be decreased, resulting in decreased stiffness for the tip 26D and decreased resonance frequency.

Methods of Tuning Resonant Frequency of a Cantilever Sensor

Figure 10A:
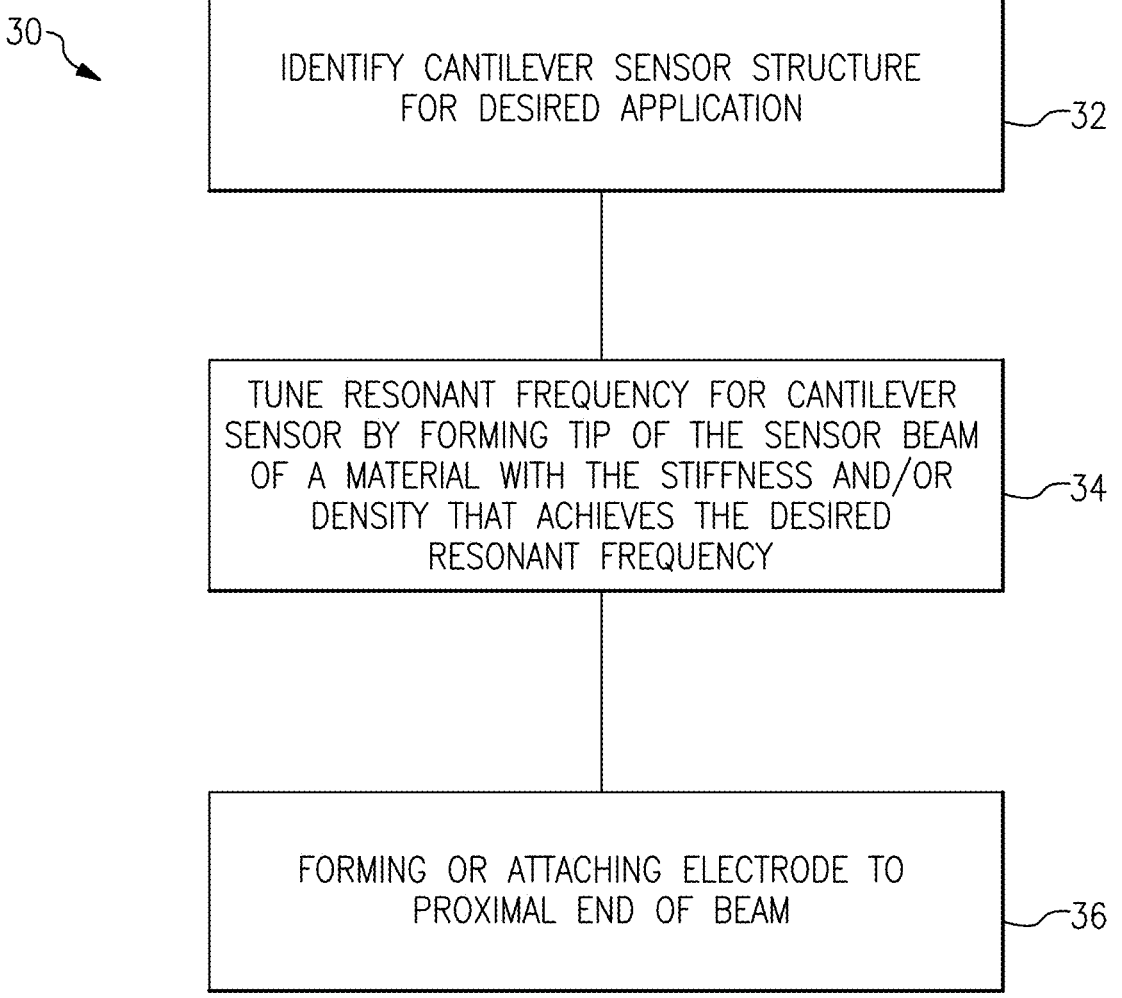
FIG. 10A is a flow diagram of a method of tuning a cantilever sensor.

FIG. 10A shows a method 30 for tuning or modifying the resonant frequency of a cantilever sensor, such as the cantilever sensor 20 described above. The method 30 includes the step 32 of identifying for the desired application the cantilever sensor structure. The method 30 also includes the step 34 of modifying the resonant frequency of the cantilever sensor by forming at least a portion of a beam of the sensor (e.g., forming a tip or distal portion of the beam of the sensor) of a material having a density and/or Young's modulus that provides the desired resonant frequency. The method 30 includes the step 36 of forming or attaching an electrode to a proximal end of the beam of the sensor.

Figure 10B:
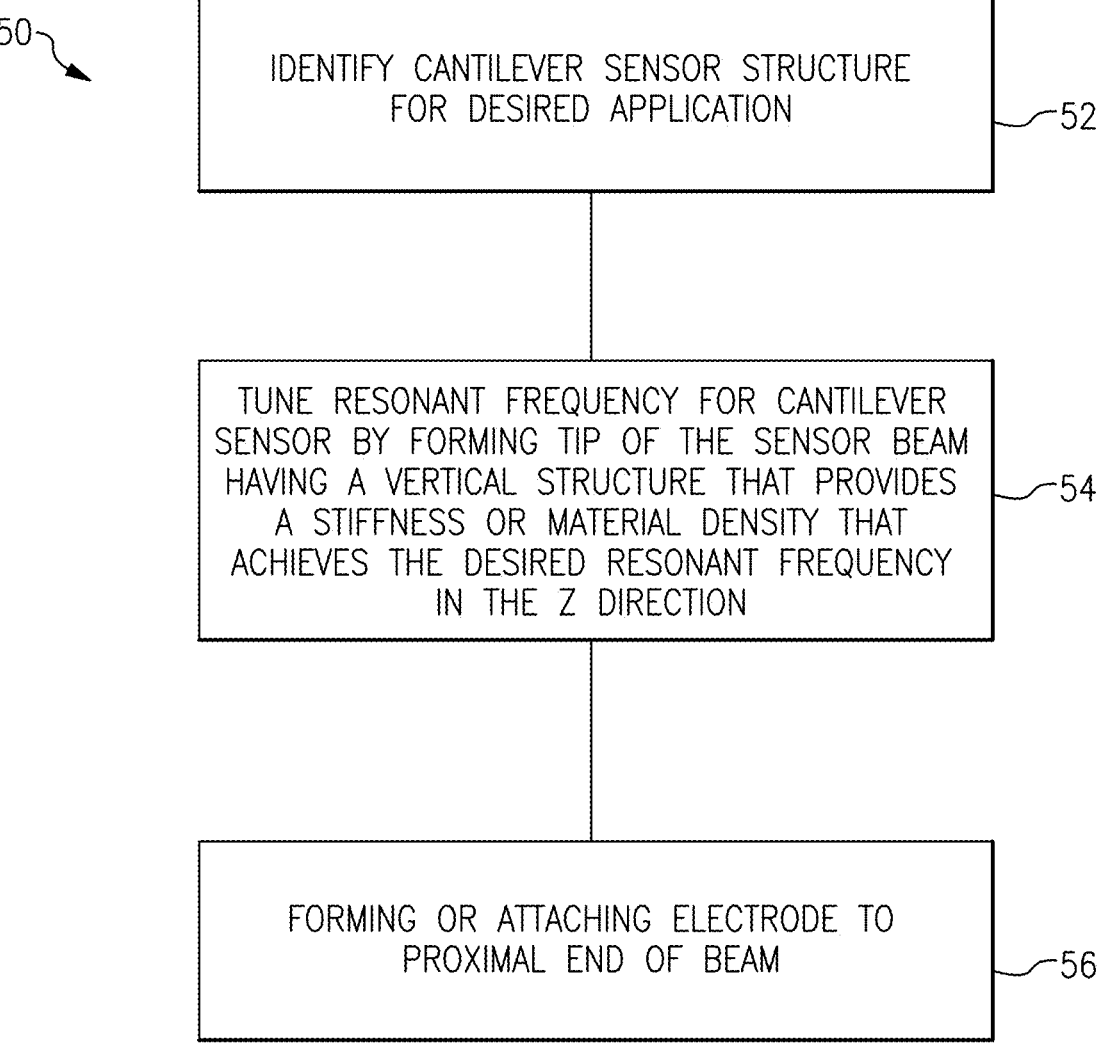
FIG. 10B is a flow diagram of a method of tuning a cantilever sensor.

FIG. 10B shows a method 50 for tuning or modifying the resonant frequency of a cantilever sensor, such as the cantilever sensor 20 described above. The method 50 includes the step 52 of identifying for the desired application the cantilever sensor structure. The method 50 also includes the step 54 of modifying the resonant frequency of the cantilever sensor by forming at least a portion of a beam of the sensor (e.g., forming a tip or distal portion of the beam of the sensor) with a vertical structure that provides a stiffness or material density that results in the desired resonant frequency in the Z direction. The beam (e.g., tip of the beam) can be formed so that it has a non-rectangular cross-section transverse to a length of the beam. The method 50 includes the step 56 of forming or attaching an electrode to a proximal end of the beam of the sensor.

The cantilevered sensors described herein (e.g., cantilevered sensors 20A, 20B, 20C, 20D) advantageously provide increased performance (e.g., increased resonant frequency) as a cantilever sensor (e.g., cantilever sensor 20) having same length and width. The methods 30, 50 in FIGS. 10A-10B can be used to tune the resonant frequency for the cantilever sensor.

Figure 11:
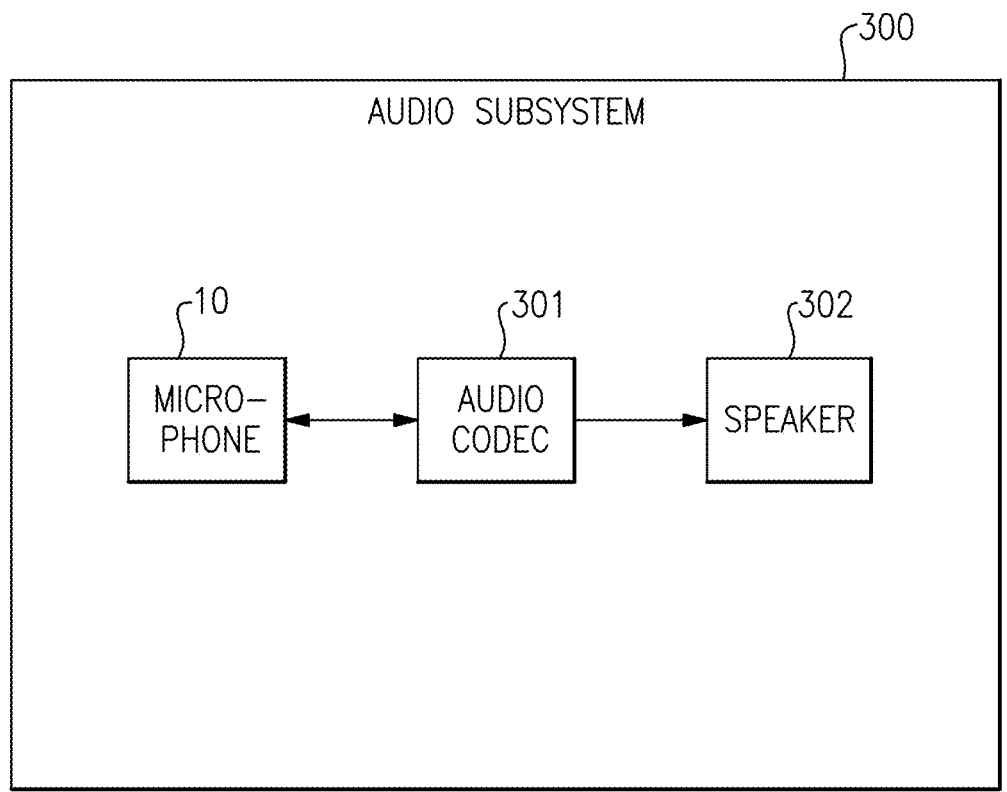
FIG. 11 is a schematic diagram of an audio subsystem.

FIG. 11 is a schematic diagram of an audio subsystem 300. The audio subsystem 300 can include one or more microphones 10. In one implementation, at least one of the microphone(s) 10 is a piezoelectric MEMS microphone. The microphone(s) 10 can communicate with an audio codec 301, which can control the operation of the microphone(s) 10. The audio codec 301 can also communicate with a speaker 302 and control the operation of the speaker 302.

Figure 12:
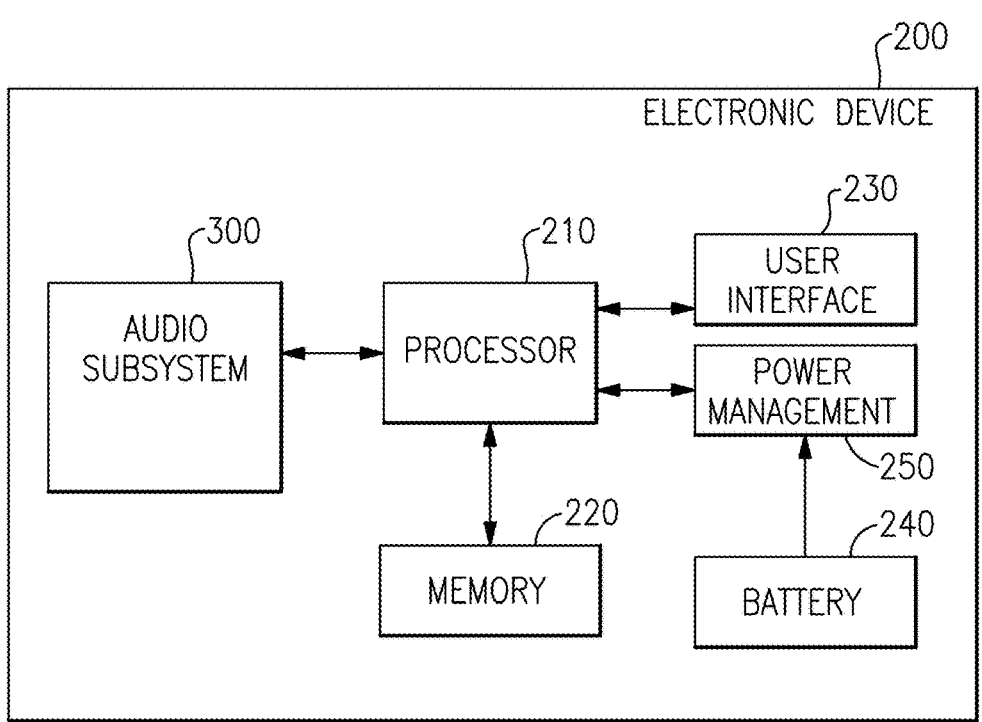
FIG. 12 is a schematic diagram of an electronic device.

FIG. 12 is a schematic diagram of an electronic device 200 that includes the audio subsystem 300. The electronic device 200 can optionally have one or more of a processor 210, a memory 220, a user interface 230, a battery 240 (e.g., direct current (DC) battery) and a power management module 250. Other additional components, such a display and keyboard can optionally be connected to the processor 210. The battery 240 can provide power to the electronic device 200.

It should be noted that, for simplicity, only certain components of the electronic device 200 are illustrated herein. The control signals provided by the processor 210 control the various components within the electronic device 200.

The processor 210 communicates with the user interface 230 to facilitate processing of various user input and output (I/O), such as voice and data. As shown in FIG. 12, the processor 210 communicates with the memory 220 to facilitate operation of the electronic device 200.

The memory 220 can be used for a wide variety of purposes, such as storing data and/or instructions to facilitate the operation of the electronic device 200 and/or to provide storage of user information.

The power management system or module 250 provides a number of power management functions of the electronic device 200. In certain implementations, the power management system 250 includes a PA supply control circuit that controls the supply voltages of power amplifiers. For example, the power management system 250 can change the supply voltage(s) provided to one or more power amplifiers to improve efficiency.

As shown in FIG. 12, the power management system 250 receives a battery voltage from the battery 240. The battery 240 can be any suitable battery for use in the electronic device 200, including, for example, a lithium-ion battery.

Figure 13:
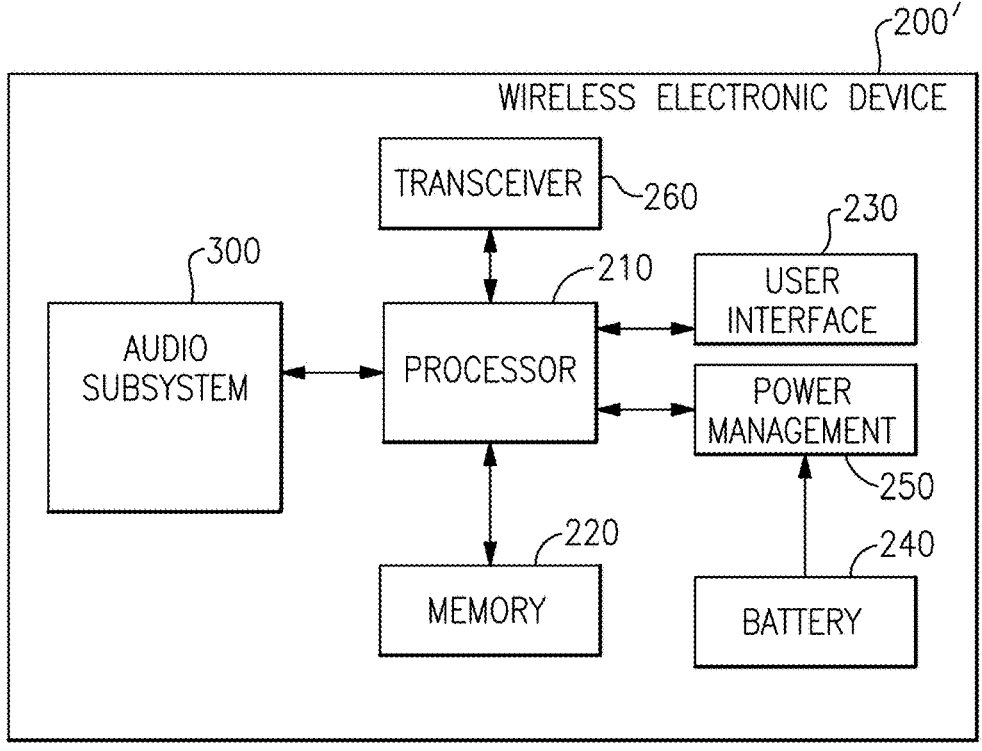
FIG. 13 is a schematic diagram of a wireless electronic device.

FIG. 13 is a schematic diagram of a wireless electronic device 200' The wireless electronic device 200' is similar to the electronic device 200 in FIG. 12. Thus, reference numerals used to designate the various components of the wireless electronic device 200' are identical to those used for identifying the corresponding components of the electronic device 200 in FIG. 12. Therefore, the structure and description above for the various features of the electronic device 200 in FIG. 12 are understood to also apply to the corresponding features of the wireless electronic device 200' in FIG. 13, except as described below.

The wireless electronic device 200' differs from the electronic device 200 in that it also includes a transceiver 260 that communicates (e.g., two-way communication) with the processor 210. Signals, data and/or information received (e.g., wirelessly) by the transceiver 260 (e.g., from a remote electronic device, such a smartphone, tablet computer, etc.) is communicated to the processor 210, and signals, data and/or information provided by the processor is communicated (e.g., wirelessly) by the transceiver 260 (e.g., to a remote electronic device). Further, the function of the transceiver 260 can be integrated into separate transmitter and receiver components.

The wireless electronic device 200' can be used to communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 260 generates RF signals for transmission and processes incoming RF signals received from antennas. It will be understood that various functionalities associated with the transmission and receiving of RF signals can be achieved by one or more components that are collectively represented in FIG. 13 as the transceiver 260. In one example, separate components (for instance, separate circuits or dies) can be provided for handling certain types of RF signals.

The processor 210 provides the transceiver 260 with digital representations of transmit signals, which the transceiver 260 processes to generate RF signals for transmission. The processor 210 also processes digital representations of received signals provided by the transceiver 260.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc., may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A cantilever sensor with increased resonant frequency, comprising:

a substrate;

a beam having a proximal portion attached to the substrate and extending to an unsupported distal end of the beam; and an electrode disposed on or in the proximal portion of the beam, a tip of the beam extending distally of the electrode, at least a portion of the tip having a greater height in a Z direction transverse to a length of the beam than the proximal portion of the beam, the tip including a first side edge and a second side edge that have a greater height than a beam portion between the first and second side edges.

2. The sensor of claim 1 wherein the tip is defined by a corrugated portion with alternating first portions of relatively smaller height and second portions of relatively greater height.

3. The sensor of claim 1 wherein the beam portion of the tip between the first and second side edges has a smaller thickness than the proximal portion of the beam.

4. The sensor of claim 3 wherein the tip includes one or more ridges spaced between the first and second side edges and attached to the beam portion between the first and second side edges.

5. The sensor of claim 4 wherein the one or more ridges are a plurality of ridges spaced apart from each other and from the first and second side edges.

6. The sensor of claim 1 wherein the sensor is one of an acoustic sensor, an accelerometer, an ultrasonic transducer and an energy harvesting member.

7. A piezoelectric microelectromechanical systems microphone, comprising:

a substrate; and a plurality of piezoelectric sensors movably coupled to the substrate, each of the piezoelectric sensors spaced apart from an adjacent piezoelectric sensor by a gap and including: a beam having a proximal portion attached to the substrate and extending to an unsupported distal end of the beam, and an electrode disposed on or in the proximal portion of the beam, a tip of the beam extending distally of the electrode, at least a portion of the tip having a greater height in a Z direction transverse to a length of the beam than the proximal portion of the beam, the tip including a first side edge and a second side edge that have a greater height than a beam portion between the first and second side edges, the plurality of piezoelectric sensors configured to deflect when subjected to sound pressure.

8. The microphone of claim 7 wherein the tip is defined by a corrugated portion with alternating first portions of relatively smaller height and second portions of relatively greater height.

9. The microphone of claim 7 wherein the beam portion of the tip between the first and second side edges has a smaller thickness than the proximal portion of the beam.

10. The microphone of claim 9 wherein the tip includes one or more ridges spaced between the first and second side edges and attached to the beam portion between the first and second side edges.

11. The microphone of claim 10 wherein the one or more ridges are a plurality of ridges spaced apart from each other and from the first and second side edges.

12. The microphone of claim 7 wherein the beam is a triangular beam, the unsupported distal end of the triangular beam being the tip.

13. An audio subsystem, comprising:

an audio codec; and one or more piezoelectric microelectromechanical systems microphones in communication with the audio codec, each microphone including: a substrate and a plurality of piezoelectric sensors movably coupled to the substrate, each of the piezoelectric sensors spaced apart from an adjacent piezoelectric sensor by a gap and including a beam having a proximal portion attached to the substrate and extending to an unsupported distal end of the beam, an electrode disposed on or in the proximal portion of the beam, a tip of the beam extending distally of the electrode, at least a portion of the tip having a greater height in a Z direction transverse to a length of the beam than the proximal portion of the beam, the tip including a first side edge and a second side edge that have a greater height than a beam portion between the first and second side edges.

14. The audio subsystem of claim 13 wherein the tip is defined by a corrugated portion with alternating first portions of relatively smaller height and second portions of relatively greater height.

15. The audio subsystem of claim 13 wherein the beam portion of the tip between the first and second side edges has a smaller thickness than the proximal portion of the beam.

16. The audio subsystem of claim 15 wherein the tip includes one or more ridges spaced between the first and second side edges and attached to the beam portion between the first and second side edges.

17. The audio subsystem of claim 16 wherein the one or more ridges are a plurality of ridges spaced apart from each other and from the first and second side edges.

18. The audio subsystem of claim 13 wherein the beam is a triangular beam, the unsupported distal end of the triangular beam being the tip.

* * * * *